(12) United States Patent
Springett

(10) Patent No.: US 7,468,648 B2
(45) Date of Patent: Dec. 23, 2008

(54) MAGNETIC DEVICE

(75) Inventor: Nigel Springett, Emmendingen (DE)

(73) Assignee: DET International Holding Limited, George Town, Grand Cayman (KY)

( * ) Notice: Subject to any disclaimer, the term of this patent is extended or adjusted under 35 U.S.C. 154(b) by 0 days.

(21) Appl. No.: 10/592,245

(22) PCT Filed: Mar. 10, 2004

(86) PCT No.: PCT/CH2004/000141

§ 371 (c)(1),
(2), (4) Date: Jul. 24, 2007

(87) PCT Pub. No.: WO2005/086185

PCT Pub. Date: Sep. 15, 2005

(65) Prior Publication Data

US 2007/0296533 A1    Dec. 27, 2007

(51) Int. Cl.
*H01F 5/00* (2006.01)

(52) U.S. Cl. .......................... 336/200; 336/223; 336/232

(58) Field of Classification Search .................. 336/200, 336/223, 232
See application file for complete search history.

(56) References Cited

U.S. PATENT DOCUMENTS

| | | | |
|---|---|---|---|
| 5,949,191 A | 9/1999 | Cassese et al. | |
| 6,069,548 A | 5/2000 | Baarman et al. | |
| 6,073,339 A | 6/2000 | Levin | |
| 6,239,683 B1 | 5/2001 | Roessler et al. | |
| 6,466,454 B1 * | 10/2002 | Jitaru | 361/836 |
| 7,068,133 B2 * | 6/2006 | Ries | 335/216 |

FOREIGN PATENT DOCUMENTS

| | | |
|---|---|---|
| EP | 0 507 360 B1 | 5/1996 |
| GB | 2 317 751 A | 4/1998 |
| WO | WO 2004/040599 A1 | 5/2004 |

* cited by examiner

*Primary Examiner*—Anh T Mai
(74) *Attorney, Agent, or Firm*—Gallagher & Kennedy, P.A.; Thomas D. MacBlain

(57) ABSTRACT

A magnetic device to be surface mounted on a substantially planar thermally conductive surface comprises a circuit board containing a winding pattern having at least one winding and a magnetic core that is at least partially encompassing the winding pattern. On a bottom side of the circuit board a region corresponding to a substantial part of the winding pattern is covered by a thermally conductive material for thermally contacting the thermally conductive surface. A transformer arrangement comprises such a magnetic device as well as a thermally clad circuit board having a surface area covered by a thermally conductive material, corresponding to at least substantially the covered region on the bottom side of the circuit board. For assembly, the covered region on the bottom side of the circuit board is soldered to the covered region on the surface of the thermally clad circuit board. The extensive cover and thermal contact to the thermally conductive surface allows for heat transfer from the complete winding area, reducing the total thermal resistance and temperature gradients in the winding structure. The solution is inexpensive and easy to manufacture.

21 Claims, 3 Drawing Sheets

MAGNETIC DEVICE

CROSS REFERENCE TO RELATED APPLICATIONS

This application is the National Stage application of the Patent Cooperation Treaty Application No. PCT/CH2004/000141, from which priority is claimed.

TECHNICAL FIELD

The invention relates to a magnetic device to be surface mounted on a substantially planar thermally conductive surface, comprising a circuit board containing a winding pattern having at least one winding and a magnetic core at least partially encompassing the winding pattern. The invention further relates to a transformer arrangement comprising the magnetic device.

BACKGROUND ART

Power supplies often substantially determine the size of electronic circuits or devices. Due to this reason, compact and highly efficient planar transformers have been developed.

For example, the U.S. Pat. No. 6,069,548 (Nokia) discloses a planar transformer constituted by a supplementary circuit board surrounded by a magnetic core. The planar transformer is conventionally surface mounted on a motherboard by a plurality of pins soldered to tracks on the motherboard.

One of the limiting factors in the design and application of such transformers is heat removal. In many cases the amount of power that can be processed through a transformer is purely dependent upon the thermal limitations imposed by the transformer. Often, a physically larger transformer is used purely because it can dissipate more heat than a smaller one due to its larger surface area, despite the fact that the larger transformer generates more losses than the smaller one.

The conventional method of removing heat from a transformer circuit consists in mechanically attaching a heatsink to the magnetic core and/or the windings. This heat sink usually covers only part of the core or the windings and has to be electrically isolated. Apart from the extra expense involved, the improvement in heat transfer is marginal.

The U.S. Pat. No. 6,239,683 B1 (Tyco Electronics Logistics A.G.) describes a flat transformer that is surface mounted on a substantially planar substrate by means of a plurality of relatively massive conductive posts. The posts are electrically connected to the transformer windings and may support the removal of heat from the transformer circuit.

However, the removal of heat is only effective in local areas surrounding the places of attachment of the posts. Furthermore, the joints between the posts and the transformer need a higher melting point than the joints with the substrate in order to prevent melting during final assembly. The posts add unwanted inductance and resistance and increase the total assembly height.

SUMMARY OF THE INVENTION

It is the object of the invention to create a magnetic device pertaining to the technical field initially mentioned, that is inexpensive, allows for efficient heat removal, avoids high temperature gradients and adds no extra inductance or resistance.

According to the invention, a magnetic device to be surface mounted on a substantially planar thermally conductive surface and comprising (a) a circuit board containing a winding pattern forming at least one winding, and (b) a magnetic core at least partially encompassing the winding pattern has, on a bottom side of the circuit board, a region corresponding to a substantial part of the winding pattern that is covered by a thermally conductive material, for thermally contacting the substantially planar thermally conductive surface. In a preferred exemplary embodiment the thermally conductive material is copper.

The thermal pad formed by the extensive cover and the large area thermal contact to the thermally conductive surface allows for transferring heat from the complete winding area, reducing the total thermal resistance and temperature gradients in the winding structure. The solution is inexpensive and the inventive device may be conventionally surface mounted by soldering, such that extra steps during assembly are avoided. Because no pins or posts are utilized for thermally and electrically connecting the magnetic device to the motherboard no extra inductance or resistance is created by the electrical connection between the device and the board. At the same time, the mechanical stability is improved and the required space is reduced. The inventive magnetic device has a wide range of applications, namely for transformers and inductors in electrical or electronic devices.

Preferably, the covered region on the bottom side of the circuit board at least partially replicates the winding pattern, i.e. the electrically conducting tracks forming the windings. This allows for minimizing unwanted electrical effects caused by the extensive covered region, in particular relating to capacitance, while at the same time the effective transfer of heat from the entire winding area is preserved.

Alternatively, especially if the electrical properties concerning capacitance are not highly critical, the covered region may have e.g. a rectangular or oval shape covering substantially the entire winding pattern, including the gaps between the windings. Thereby, the manufacture of the cover is simplified. If the covered region encloses the magnetic core, it has to be observed that the covered region does not allow for an electrical short-circuit for the current induced by the magnetic fields in the magnetic core. This can be ensured e.g. by providing an end-to-end slit in the covered region.

Preferentially, the covered region on the bottom side of the circuit board is electrically insulated from the winding pattern. By separating the thermal components from the electrical components (i.e. the windings and their electrical connection to tracks of the motherboard) the mounting of the device is simplified. In the case of an electrically conducting connection (e.g. solder connection) between the covered region and the thermally conductive surface, there is no need for any extra insulation of the surface region contacted by the covered region of the circuit board. Furthermore, the electrical and thermal properties of the device may be independently optimized.

Advantageously, the circuit board comprises at least one thermal via that is electrically insulated from the winding pattern and thermally connected to the covered region on the bottom side of the circuit board. The vias are preferably copper-plated. As opposed to the usual electrical vias, which also play a crucial role for heat transfer, they do not as well have an electrical function. Thermal vias may therefore be arranged independently of electrical preconditions, such that they additionally transfer heat from critical "hot-spot" regions of the winding pattern, especially from the center of the windings. The thermal vias end in the extensive area on the bottom side of the circuit board, covered by the thermally conductive material. Alternatively, they are electrically and/ or thermally insulated from the large area and end separately in small thermally conductive areas surrounding the lower end of the via.

Alternatively, the circuit board may just contain a number of usual (electrical) vias connecting the windings. These alone already have a beneficial effect on heat transfer, especially if they are thermally connected to the thermally conducting surface.

Preferably, the circuit board comprises a plurality of windings constituted by a plurality of planar conductive patterns stacked upon one another and separated by insulating layers. This allows for easily arranging a plurality of stacked windings as required e.g. in transformers.

Alternatively, a transformer may be constituted by a plurality of windings formed in the same layer and coiling around two legs of the same magnetic core. In another embodiment, a single winding is formed on the circuit board and at least one further winding is formed on or below the planar surface.

A further device may be surface mounted on a top side of the circuit board. This allows for producing a transformer circuit assembly that includes the magnetic device as well as further devices such as filters or rectifiers for control or electrical adaptation of the transformer. This assembly may be integrally mounted on the substrate and does not require the arrangement of further transformer related devices on the motherboard. Furthermore, due to the short connection between the further devices arranged on the circuit board and the magnetic component of the device, the size of high frequency current loops is minimized, and thus both parasitic inductance and insertion impedance. This effect is particularly advantageous in the case of the further devices comprising a high frequency switching electronic component as it is utilized in switched mode power processing converters. Cooling of the further devices is provided through the surface mount connections to the circuit board and may be improved by arranging extra thermal vias leading to the bottom side of the circuit board.

A transformer arrangement comprises a magnetic device according to the invention as well as a thermally clad circuit board forming the substantially planar thermally conducting surface. A region of the surface corresponding to at least substantially the covered region on the bottom side of the circuit board is covered by a thermally conductive material, in particular by copper. The covered region on the bottom side of the circuit board is soldered to the covered region of the thermally clad circuit board. The extensive solder connection between the extensive regions covered by thermally conducting materials ensures unhindered heat transfer from the magnetic device to the thermally conducting surface of the motherboard. Furthermore, the connection is produced in a conventional way, not requiring any additional or special steps during assembly of the device comprising the transformer arrangement.

Preferably, the thermally clad circuit board is an insulated metal surface (IMS) board, i.e. made up of a metallic base layer and a circuit layer, separated by an insulating layer to prevent unwanted current flow between the circuit layer and the base layer. In (or on) the circuit layer electrically conductive tracks, e.g. of copper, are formed. The metallic base layer is usually the thickest layer of the IMS and preferably includes aluminum. However, other metals or compounds having a good thermal and/or electrical conductivity may be utilized as well. Due to the metallic base layer, the IMS board has a large heat capacity as well as heat conductivity and therefore qualifies as an efficient heatsink. Furthermore, the metallic layer provides a shielding of the components mounted on the circuit layer of the IMS board. The conductive tracks on the circuit layer may form a large thermally conductive surface and thereby allow for efficient transfer of heat generated in the magnetic device to the IMS. In this respect, copper is preferred due to its large heat conductivity and due to the fact that it may be easily processed.

Alternatively, the thermally clad circuit board may be a DCB (direct copper bonded) circuit board where a thin copper foil is eutectically bonded to the base, typically to an $Al_2O_3$ ceramic substrate having a good thermal conductivity. Another alternative is a circuit board comprising a copper foil that is bonded to the metallic base by an insulating thin adhesive foil (cold adhesion).

In certain applications it may be desirable that the IMS board comprises a metallic base layer as well as a plurality of copper layers separated from each other by insulating layers. The extra layers may be used e.g. for electrical screening, thereby reducing the effects of electromagnetic interference (EMI) to other devices mounted on the IMS board.

In certain embodiments of the inventive transformer arrangement a transformer winding is formed on the thermally clad circuit board. The winding is constituted by a track coiled around the magnetic core, formed by an electrically conducting material. The winding may be formed in an outer layer as well as in an inner layer of the thermally clad circuit board. Especially in the case of circuit boards comprising a plurality of circuit layers, a plurality of windings may be formed in the thermally clad circuit board. If the winding is formed on an IMS, the metallic base layer has to be provided by a slit in order to prohibit an electrical short-circuit in the metallic layer for the current induced by the magnetic fields in the magnetic core. This is described in detail in the International patent application No. PCT/CH02/00588 (Delta Energy Systems). By forming the winding directly on the thermally clad circuit board the required space may be reduced, in particular concerning the total height of the magnetic device above the motherboard. Secondly, cooling of the windings formed on the motherboard is easy because the generated heat is directly dissipated through the thermally clad board.

Preferably, the thermally clad circuit board comprises at least one cut-out or indent for accommodating a part of the magnetic core. This allows for mounting the magnetic device more closely to the surface of the motherboard, thereby reducing the height of the assembled arrangement. In the case of windings being formed on the thermally clad circuit board a cut-out is required such that the windings may be arranged such as to coil around the magnetic core.

Other advantageous embodiments and combinations of features come out from the detailed description below and the totality of the claims.

BRIEF DESCRIPTION OF THE DRAWINGS

The drawings used to explain the embodiments show.

In the Figures, the same components are given the same reference symbols.

DETAILED DESCRIPTION OF PREFERRED EMBODIMENTS

Figure 1:
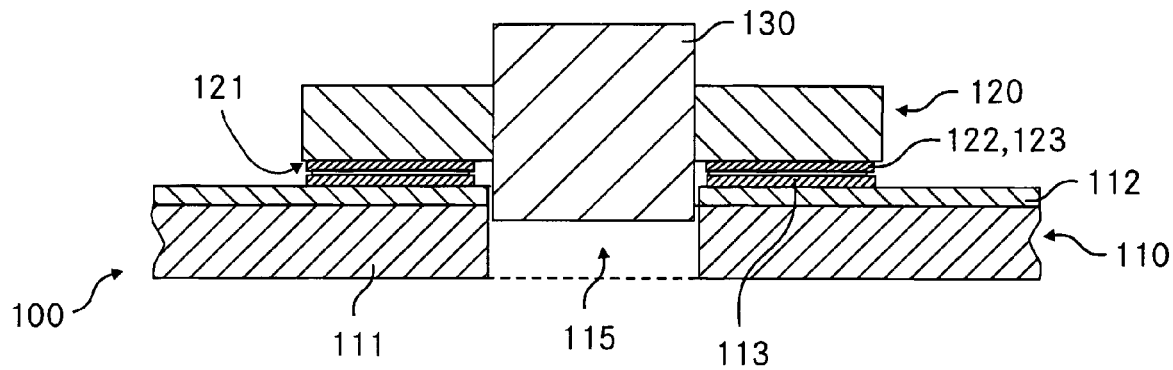
FIG. 1 a fragmentary cross-sectional view along a vertical plane through the principal axis of the transformer windings of a first embodiment of the inventive transformer arrangement.
Figure 2:
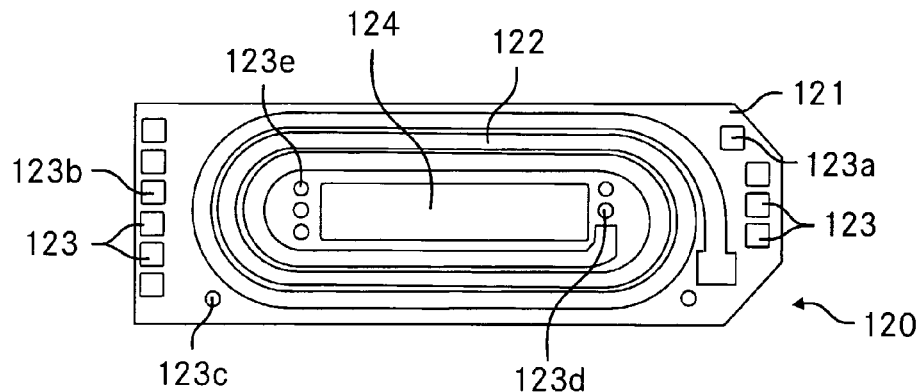
FIG. 2 a plan view of the solderside of the circuit board carrying the windings.
Figure 3:
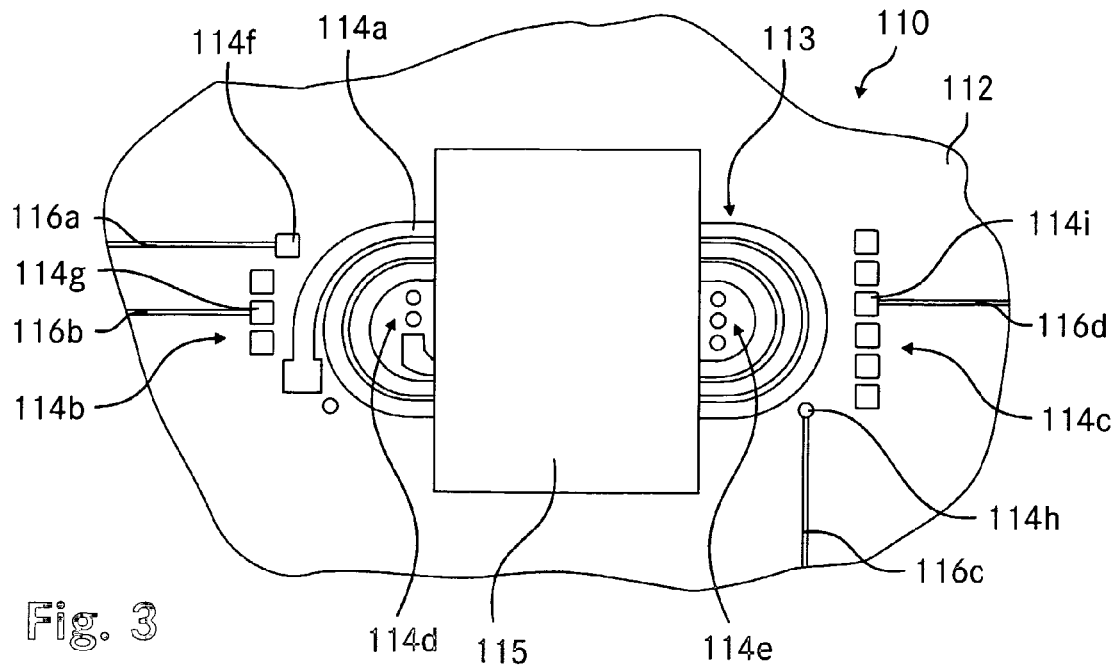
FIG. 3 a fragmentary plan view of the upper side of the motherboard.

The FIGS. 1-3 show schematic representations of an inventive transformer arrangement. The FIG. 1 is a cross-sectional view along a vertical plane running through the principal axis of the transformer windings. The FIG. 2 is a plan view of the solderside of the circuit board carrying the windings. The FIG. 3 is a plan view of the upper side of the motherboard.

The transformer arrangement 100 is constituted by the motherboard 110, the additional circuit board 120 carrying the windings and the magnetic core 130 surrounding and passing through the circuit board 120. The motherboard 110 is an insulated metal surface board (IMS) composed of three layers. The metallic base layer 111, which usually is the thickest of the IMS layers, consists of aluminum. The insulating layer 112 covering the base layer 111 is made of a plastic material, e.g. of F24 which is a commonly used dielectric substrate material in circuit board design. The top layer 113 is constituted by a thin copper foil, where several tracks 114 of copper as visible in FIG. 3 have been produced by an etching process where those areas of the copper foil that are not needed within the top layer 113 have been etched away. The thicknesses of the layers of the IMS may vary from a few micrometers to several millimeters, depending on the application. The motherboard 110 further features a cut-out 115 for accommodating the lowermost portion of the magnetic core 130.

The details of the structure of the additional circuit board 120 are not displayed. In general, the circuit board 120 comprises a plurality of windings constituted by a plurality of planar conductive patterns stacked upon one another and separated by insulating layers. Windings on different layers may be connected to each other by vias. This arrangement of stacked planar windings is known as such from components of prior art flat transformers. However, in contrast to the state of the art, a copper track 122 is applied on the bottom side 121 of the circuit board 120. In the example displayed in FIG. 2, the copper track 122 replicates the winding pattern of the windings in the circuit board 120, in that the dimension and form of the track corresponds to the windings arranged in parallel on higher layers of the circuit board 120. The copper track 122 is applied on an insulating surface and there is no electrical connection to the windings contained in the circuit board 120.

Furthermore, the bottom side 121 of the circuit board 120 features the endings of a plurality of vias 123. Some of the vias, as e.g. the vias 123*a*, 123*b*, 123*c*, are electrically connected to the windings formed in the layers of the circuit board 120. Additionally, they support the dissipation of heat through the circuit board 120. Other vias, as e.g. the vias 123*d*, 123*e*, do not have any electrical function and purely serve as heat drains to dissipate heat generated in the windings, i.e. they are purely thermal vias. The vias may be constituted by through-holes piercing the layers of the circuit board 120, whereby the inner wall of a through-hole is copper-plated. The hole may be further filled with solder or another thermally conductive material. In general, the circuit board 120 may comprise any kinds of vias, such as through-hole vias, blind vias, buried vias etc.

The pattern of the copper track 122 and the vias 123 of the circuit board 120 is again replicated by the copper tracks 114 on the top layer 113 of the motherboard 110. The copper track 114*a* for example is a mirror image of the copper track 122 on the bottom side of the circuit board 120. As well replicated by further copper tracks 114*b*, 114*c*, 114*d*, 114*e* are the positions of the endings of the vias 123.

For assembling the transformer arrangement, the magnetic core 130 which consists e.g. of two identical E-shaped parts is mounted to the circuit board 120 in a first step, in such a way, that a central leg of the magnetic core 130 pierces the central opening 124 of the circuit board 120 and that two side legs parallel to the central leg run sideways of the circuit board 120. The circuit board 120 and the magnetic core 130 form a magnetic device which is surface mounted onto the motherboard 110 in a second step. This is accomplished by soldering the bottom side 121 of the circuit board 120 onto the top layer 113 of the motherboard 110. The solder connections are formed between the copper tracks 114 on the top layer 113 of the motherboard 110 and the copper tracks 122 and the endings of the vias 123 on the bottom side 121 of the circuit board 120. After mounting the magnetic device to the motherboard 110 the lower portion of the magnetic core 130 partially resides within the cut-out 115 of the motherboard 110.

The solder connection between the bottom side 121 (or solderside) of the circuit board 120 and the top layer 113 of the motherboard 110 allows for efficiently transferring heat generated in the windings to the motherboard 110, which due to its metallic base layer 111 acts as an excellent heatsink for the transformer device 100. Furthermore, some of the copper tracks 114 of the top layer 113 of the motherboard may contact endings of electrical vias 123 and lead to further devices arranged on the motherboard 110, such as resistors, inductors, capacitors, microchips etc, thereby electrically connecting the magnetic device to these devices. In the example displayed in FIGS. 1-3 the copper tracks 114*f*, 114*g*, 114*h*, 114*i* are contacted by conductive tracks 116*a*, 116*b*, 116*c*, 116*d*. The other copper tracks 114 displayed purely serve for accepting and dissipating heat from the counterpart track 122 or vias 123 on the circuit board 120.

Figure 4:
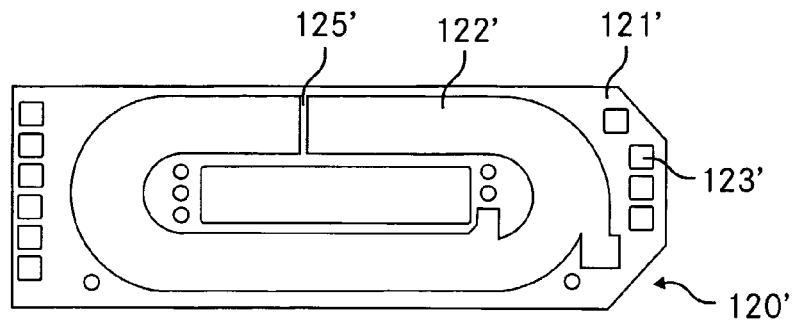
FIG. 4 a schematical plan view of the bottom side of another embodiment of a circuit board carrying transformer windings.

The FIG. 4 is a schematical plan view of the bottom side 121' of another embodiment of a circuit board 120' carrying transformer windings. In contrast to the first embodiment displayed in FIG. 2 the winding pattern of the transformer windings is not exactly reproduced by the copper track 122'. Instead, the copper track 122' substantially covers the winding area including the gaps present in between the windings. A slit 125' is provided in the covered area in order to prohibit an electrical short-circuit for the current induced by the magnetic fields in the magnetic core. The endings of the vias 123' are electrically insulated from the copper track 122' such that they may still be used for electrical connections between electrical elements of the circuit board 120' and the motherboard 110.

Figure 5:
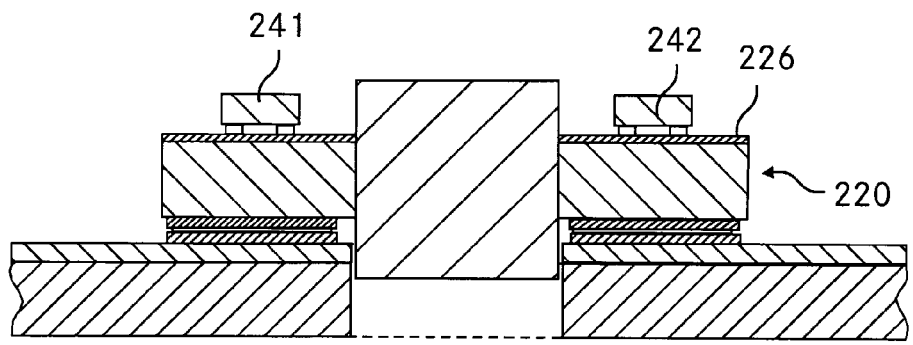
FIG. 5 a fragmentary cross-sectional view of a further embodiment of the invention with further components surface mounted to the magnetic device.

The FIG. 5 schematically depicts a cross-sectional view of a further embodiment of the invention. In principle, the configuration corresponds to the first embodiment displayed in FIGS. 1-3. However, the circuit board 220 of the magnetic device features a top layer 226 which allows for surface mounting of further components 241, 242, such as devices for control or electrical adaptation of the transformer, e.g. high frequency switching electronic components. Due to the short connection between the further components 241, 242 and the magnetic component of the device the size of high frequency current loops and therefore both parasitic inductance and insertion impedance are reduced compared to the case where the further components are mounted to the motherboard. Heat generated by the further components 241, 242 is partially dissipated through electrical and thermal vias of the circuit board 220. The components may be mounted such as to benefit from the usual vias of the circuit board 220 or extra vias may be implemented into the circuit board 220 for the further components 241, 242.

Figure 6:
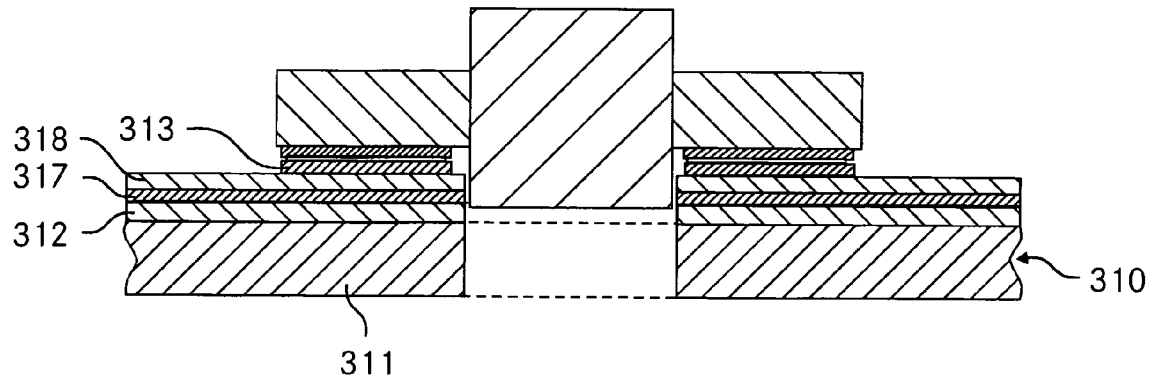
FIG. 6 a fragmentary cross-sectional view of a further embodiment of the invention featuring a motherboard having an additional copper layer.

The FIG. 6 schematically depicts a cross-sectional view of a further embodiment of the invention. In principle, the configuration corresponds to the first embodiment displayed in FIGS. 1-3. However, the motherboard 310 features an additional copper layer 317 arranged in between the insulating layer 312 and the top layer 313, separated from the top layer 313 by an additional insulating layer 318. The additional copper layer 317 may be used for electrical screening or may allow the forming of more complex magnetic structures.

Figure 7:
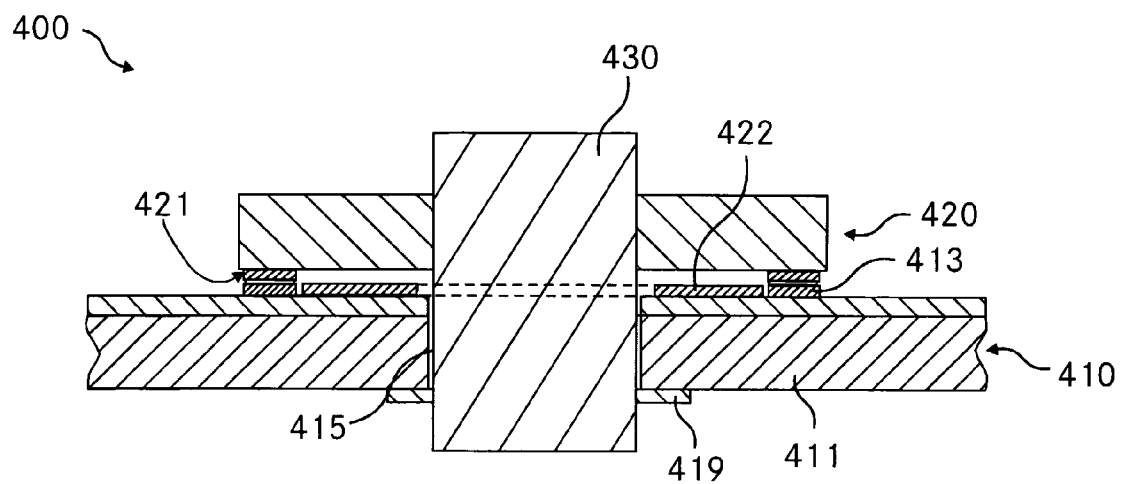
FIG. 7 a fragmentary cross-sectional view of a further embodiment of the invention, having a transformer winding formed on the motherboard.
Figure 8:
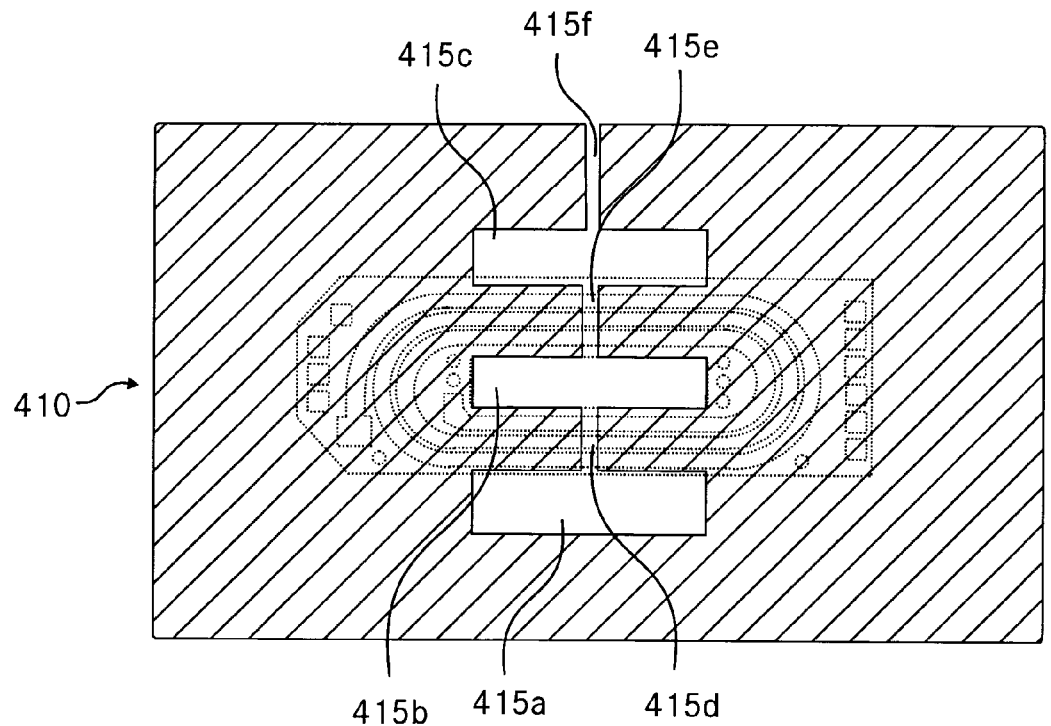
FIG. 8 a cross-sectional view of the metallic base layer of the motherboard.

The FIGS. 7 and 8 schematically depict a further embodiment of the invention. The FIG. 7 is again a cross-sectional view along a vertical plane running through the principal axis of the transformer windings. In contrast to the other embodiments described, the lowermost transformer winding of the transformer arrangement 400 is formed on the motherboard 410, namely in its top layer 413. The winding is formed by a corresponding copper track 422 in the top layer 413 that is electrically insulated from further areas of the top layer 413, namely from the thermal pads soldered to the bottom side 421 of the circuit board 420. The winding is electrically contacted by respective tracks on the top layer 413 for connection to further devices on the motherboard 410.

The heat generated in the lowermost winding is directly transferred to the metallic base layer 411 of the motherboard 410. The heat generated in higher windings implemented on the circuit board 420 is dissipated through the solder connections between the circuit board 420 and the motherboard 410, arranged in peripheral regions surrounding the region of the winding formed on the motherboard 410. For improving heat dissipation central thermal vias may be connected to respective tracks on the top layer 413 of the motherboard 410, insulated from the winding. Furthermore, the central portion of the bottom side 421 of the circuit board 420 may be coated by a material having a good heat conductivity but which does not affect the electrical properties of the transformer arrangement.

The magnetic core 430 surrounds all the windings of the transformer as well as portions of the motherboard 410. For this purpose, three cut-outs 415a, 415b, 415c for the three legs of the magnetic core 430 are formed in the motherboard 410 (see FIG. 8). In order to prohibit an electrical short-circuit in the metallic base layer 411 for the current induced by the magnetic fields in the magnetic core 430 the three cut-outs 415a, 415b, 415c are joined to each other by slits 415d, 415e, and a further slit 415f leads to the edge of the motherboard 410. An insulator 419 is arranged at the bottom side of the metallic base layer 411 in order to prohibit electrical contact between the magnetic core 430 and the metallic base layer 411.

The aspects of the different embodiments described above may be combined, i.e. an inventive transformer arrangement may comprise a magnetic device with surface mounted components mounted to a multi-layered IMS having a transformer winding formed on one of its circuit layers. For additional improvement of heat dissipation, the magnetic device may e.g. be provided with a common heat sink mechanically attached to the upper side of the circuit board carrying the transformer windings. Finally, the configuration of the magnetic device, namely the arrangement of the windings, is not limited by the invention.

In summary, it is to be noted that the invention creates a magnetic device that is inexpensive, allows for efficient heat removal, avoids high temperature gradients and adds no extra inductance or resistance.

While detailed descriptions of preferred, exemplary embodiments of the invention have been made above, it will be appreciated that many modifications, alternatives or substitutions may be made without departure from the invention as set forth in the appended claims.

The invention claimed is:

1. A magnetic device to be surface mounted on a substantially planar thermally conductive surface comprising
   a) a circuit board containing a winding pattern having at least one winding;
   b) a magnetic core at least partially encompassing the winding pattern; where
   c) on a bottom surface of the circuit board a region of that surface corresponding to a substantial part of the winding pattern is covered by a thermally conductive material, for thermally contacting the substantially planar thermally conductive surface.

2. The magnetic device according to claim 1, wherein the covered region is copper.

3. The magnetic device according to claim 1, wherein the covered region on the bottom side of the circuit board at least partially replicates the winding pattern.

4. The magnetic device according to claim 1 or 3, wherein the covered region on the bottom side of the circuit board is electrically insulated from the winding pattern.

5. The magnetic device according to claim 1 or 3, wherein the circuit board comprises at least one thermal via that is electrically insulated from the winding pattern and thermally connected to the covered region on the bottom side of the circuit board.

6. The magnetic device according to claim 4, wherein the circuit board comprises at least one thermal via that is electrically insulated from the winding pattern and thermally connected to the covered region on the bottom side of the circuit board.

7. The magnetic device according to claim 1 or 3, wherein the circuit board comprises a plurality of windings constituted by a plurality of planar conductive patterns stacked upon one another and separated by insulating layers.

8. The magnetic device according to claim 4, wherein the circuit board comprises a plurality of windings constituted by a plurality of planar conductive patterns stacked upon one another and separated by insulating layers.

9. The magnetic device according to claim 5, wherein the circuit board comprises a plurality of windings constituted by a plurality of planar conductive patterns stacked upon one another and separated by insulating layers.

10. The magnetic device according to claim 1 or 3, wherein a further device is surface mounted on a top side of the circuit board.

11. The magnetic device according to claim 4, wherein a further device is surface mounted on a top side of the circuit board.

12. The magnetic device according to claim 5, wherein a further device is surface mounted on a top side of the circuit board.

13. A transformer arrangement comprising a magnetic device according to claim 1 or 3, and further comprising a thermally clad circuit board forming the substantially planar thermally conducting surface, whereby a region of the surface corresponding to at least substantially the covered region on the bottom side of the circuit board is covered by a thermally conductive material, in particular by copper, and whereas the covered region on the bottom side of the circuit board is soldered to the covered region on the surface of the thermally clad circuit board.

14. A transformer arrangement comprising a magnetic device according to claim 4, and further comprising a thermally clad circuit board forming the substantially planar thermally conducting surface, whereby a region of the surface corresponding to at least substantially the covered region on the bottom side of the circuit board is covered by a thermally conductive material, in particular by copper, and whereas the covered region on the bottom side of the circuit board is soldered at the covered region on the surface of the thermally clad circuit board.

15. The transformer arrangement according to claim 13, wherein the thermally clad circuit board is an insulated metal surface (IMS) board.

16. The transformer arrangement according to claim 14, wherein the thermally clad circuit is an insulated metal surface board.

17. The transformer arrangement according to claim 15, wherein the insulated metal surface (IMS) board comprises a metallic base layer and a plurality of thermally conductive layers separated from each other by insulating layers.

18. The transformer arrangement according to claim 16, wherein the insulated metal surface board comprises a metallic base layer and a plurality of copper layers separated from each other by insulating layers.

19. The transformer arrangement according to claim 13, wherein a transformer winding is formed on the thermally clad circuit board.

20. The transformer arrangement according to claim 13, wherein the thermally clad circuit board comprises at least one cut-out or indent for accommodating a part of the magnetic core.

21. A magnetic device to be surface mounted as a component on a substantially planar thermally conductive surface of a larger mother board, the magnetic device comprising
 a) a circuit board containing a winding pattern having at least one winding;
 b) a magnetic core at least partially encompassing the winding pattern; where
 c) a layer of thermally conductive material is affixed to and partially covers a bottom surface of the circuit board in a region of that surface corresponding to a substantial part of the winding pattern for thermally contacting the substantially planar thermally conductive surface of the mother board.

* * * * *